United States Patent [19]

Cohen

[11] Patent Number: 5,572,050

[45] Date of Patent: Nov. 5, 1996

[54] FUSE-TRIGGERED ANTIFUSE

[75] Inventor: Simon S. Cohen, Burlington, Mass.

[73] Assignee: Massachusetts Institute of Technology, Cambridge, Mass.

[21] Appl. No.: 349,933

[22] Filed: Dec. 6, 1994

[51] Int. Cl.$^6$ .............................. H01L 23/62; H01L 23/58
[52] U.S. Cl. .................... 257/209; 257/529; 257/665; 257/530
[58] Field of Search ............... 257/50, 209, 529, 257/530, 664, 665, 734, 773, 776, 798

[56] References Cited

U.S. PATENT DOCUMENTS

| 4,810,663 | 3/1989 | Raffel et al. | 437/19 |
|---|---|---|---|
| 4,984,054 | 1/1991 | Yamada et al. | 257/529 |
| 5,166,556 | 11/1992 | Hsu et al. | 307/465 |
| 5,258,643 | 11/1993 | Cohen | 257/530 |
| 5,304,508 | 4/1994 | Cohen | 437/170 |
| 5,373,169 | 12/1994 | McCollum et al. | 257/50 |
| 5,373,379 | 12/1994 | Nakai | 257/209 |
| 5,374,832 | 12/1994 | Tung et al. | 257/50 |
| 5,384,481 | 1/1995 | Holzworth et al. | 257/50 |
| 5,404,029 | 4/1995 | Husher et al. | 257/50 |

FOREIGN PATENT DOCUMENTS

| 0078165 | 5/1983 | European Pat. Off. . | |
|---|---|---|---|
| 483958 | 5/1992 | European Pat. Off. | 257/50 |
| 0529820 | 3/1993 | European Pat. Off. . | |
| 52-28280 | 3/1977 | Japan | 257/529 |
| 61-230336 | 10/1986 | Japan . | |
| 5-90527 | 4/1993 | Japan | 257/50 |
| 93/02473 | 2/1993 | WIPO | 257/50 |

OTHER PUBLICATIONS

Cohen, Simon, S., et al., "A Novel Double-Metal Structure for Voltage-Programmable Links," *IEEE Electron Device Letters*, 13 (9):488–490, (Sep. 1992).

Cohen, Simon S., et al., "A Novel Metal-Insulator-Metal Structure for Field-Programmable Devices," *IEEE Transactions on Electron Devices*, 40(7):1277–1283, (Jul. 1993).

Joseph L. Fabula, RCA Technical Notes, "Technical Notes Number 976: Semiconductor Fuse," Princeton, New Jersey, (Sep. 17, 1974).

*Primary Examiner*—Sara W. Crane
*Assistant Examiner*—Alice W. Tang
*Attorney, Agent, or Firm*—Hamilton, Brook, Smith & Reynolds, P.C.

[57] ABSTRACT

A programmable integrated circuit for forming conductive links includes a heat-generating programming structure through which current flows upon application of a programming voltage to heat the region around the programming structure. A programmable link structure including two conductors separated by a transformable insulator is in thermal communication with the programming circuit. When current flows through the programming circuit, the programmable link structure is heated. The heat causes the transformable insulator to break down such that a permanent conductive link is formed between the two conductors of the programmable link structure. During programming, a programming conductor is cut symmetrically about the programming structure.

21 Claims, 7 Drawing Sheets

FUSE-TRIGGERED ANTIFUSE

GOVERNMENT SUPPORT

This invention was made with government support under Contract Number F19628-90-C-0002 awarded by the Air Force. The Government has certain rights in the invention.

BACKGROUND OF THE INVENTION

In integrated circuit technology, it is often required to make or break electrical connections in order to fabricate and/or modify a circuit. For example, in programming logic arrays, certain gates and circuit elements must be connected while others must be isolated. Also, individual memory cells of programmable read only memories can be programmed by selectively connecting and isolating individual cells from certain conducting lines.

One common form of programming structure used to selectively program links between conductors is known as a programmable link structure or antifuse. The typical antifuse structure includes a lower conductor separated from an upper conductor by a transformable link insulator. Before programming, the upper and lower conductors are electrically isolated from each other. After programming, a permanent conductive link is formed between the conductors across the transformable insulator such that the upper and lower conductors are permanently connected to each other.

Individual programmable links are typically programmed by the selective application of power at the link structure. For example, prior antifuses were voltage programmable links (VPLs) programmed by applying a voltage across the upper and lower conductors. The electric field across the transformable insulator causes it to break down. The resulting current flow through the insulator heats the region around the link causing the conductors to melt and migrate into the insulator. As a result, a permanent link across the transformable insulator remains.

Another type of interlevel link is programmed by selective application of laser radiation at the programmable link structure. Laser light striking the upper conductor causes the area around the link structure to heat. The heat simultaneously causes the transformable insulator to break down and causes the metal conductors to migrate into the insulator. When the laser radiation is removed, the link site cools, leaving a permanent conductive link across the transformable insulator between the upper and lower conductors.

In antifuse devices, the breakdown characteristics of the transformable insulator determine the amount of power required for programming. One important factor which affects the breakdown characteristics of the insulator is its thickness. In general, the thinner the insulator, the lower the applied voltage required. Thus, for a VPL, a thinner insulator will generally require a lower programming voltage.

In integrated circuits, it is desirable to fabricate programmable link structures which require relatively low programming voltages to prevent stressing other devices in the circuits during programming. This results in link structures having very thin link insulator layers. However, with such thin insulator layers, unprogrammed link structures exhibit relatively high capacitance, resulting in slower overall circuit operation. In addition, such thin insulator layers can contribute to decreased lifetime of the circuit due to inadvertent programming at circuit operational voltage levels after a relatively short period of time.

SUMMARY OF THE INVENTION

The present invention is directed to a programmable integrated circuit and method for forming conductive links between conductors. The circuit includes a programmable link structure or antifuse having a pair of conductors separated by a transformable insulator and a heat generating programming structure in thermal communication with the programmable link structure. Upon application of a programming voltage, current flows through the heat generating programming structure to generate heat. The heat is communicated to the programmable link structure to form a conductive link between the conductors across the transformable insulator.

In one embodiment, the heat generating programming structure is a programmable three-terminal fuse structure as described in the commonly assigned co-pending U.S. patent application Ser. No. 08/210,344, filed Mar. 18, 1994, entitled "Three-Terminal Fuse and Method of Making Same," which is incorporated herein in its entirety by reference. The three-terminal fuse structure includes a pair of conductors separated by a thin transformable insulator material. When the programming voltage is applied across the conductors of the three-terminal fuse, the thin transformable insulator breaks down, and a transient conductive link is formed. Current flows through the transient link between the conductors to heat the region around the three-terminal fuse. The level of current is allowed to exceed that needed for forming a link at the three-terminal fuse site, and a great amount of heat is generated. In the present invention, the heat is conducted to the programmable antifuse structure and causes the permanent link to form.

Heat can cause the link to form by at least two different processes. First, the heat shock can fracture the thick transformable insulator between the conductors of the antifuse. In this case, if at least one of the conductors includes a non-refractory metal such as aluminum, the heat causes the metal to melt and flow into the fracture sites to create the permanent link. In addition to, or instead of, molten metal flowing into the fractured insulator, a link can be formed by chemical reaction between a refractory metal such as titanium in at least one of the conductors and the insulator material. For example, where the transformable insulator includes an oxide of silicon (silicon oxide) or a nitride of silicon (silicon nitride), and one or both of the conductors includes titanium, the heat causes the titanium to react with the insulator material such that titanium nitride and titanium oxides are formed and thus create the permanent conductive link. In either case, a conductive path is formed over the entire area of the link structure, resulting in a link having very high current carry capability, as opposed to prior structures in which the link is formed along a very thin filament across the insulator.

In one embodiment, the heat generating programming structure and the programmable link structure share a common conductor. This embodiment is preferably implemented in the form of a stacked structure which includes three layers of metal conductor separated by two layers of transformable insulator. The lower conductor layer, referred to herein as M1, is formed over a substrate. The thick lower transformable insulator of the antifuse structure is formed over M1. The middle conductor M2 is then formed over the thick lower antifuse link insulator. The thin upper transformable insulator of the heat generating three-terminal fuse programming structure is formed over M2, and the upper programming conductor M3 is formed over the thin upper transformable insulator.

To link M2 to M1, the programming voltage is applied across M3 and M2. The thin upper transformable insulator layer breaks down to form a transient conductive link between M2 and M3. The resulting current flowing between M2 and M3 heats the region around the programmable link site, and M2 conducts heat to the antifuse structure. As described above, the heat can cause the thick lower transformable insulator to fracture, thus allowing metal from conductors M2 and M1 to flow across the insulator. The heat can also cause refractory metal in the conductors to migrate into the transformable insulator to form the link. With sufficient voltage applied across M2 and M3, the heating around the link structure will, in addition to forming the permanent link between M2 and M1, melt conductor M3 and cause it to boil away. Thus, the continuity of the upper programming conductor M3 is permanently destroyed.

In one embodiment, the upper programming conductor M3 is formed to ensure that after the link is formed between M1 and M2, M3 is completely and symmetrically destroyed around the programming structure such that no stray conduction paths between M2 and M3 can remain after programming. In one embodiment, this is accomplished by shaping the upper conductor M3 into multiple branches which approach the link site on opposed sides of the programming structure. The programming current is split by the multiple branches such that it flows into the via of the programming structure on opposed sides. The sizes and shapes of the branches are selected such that after sufficient current has been supplied to link M1 and M2, the heat will also boil away the conductive branches of M3 equally on the opposed sides of the breakpoint of M3 such that no continuity remains between M3 and M2.

This design of the upper conductor is applicable to the heat generating programming structure used to program the antifuse of the present invention. In addition, the conductor structure is also applicable to the three-terminal fuse by itself as described in the above-referenced co-pending U.S. patent application Ser. No. 08/210,344. In the invention described in that co-pending application, the three-terminal fuse structure is used to permanently interrupt the continuity of one of a pair of conductors separated by a transformable insulator. The conductor structure described herein will result in symmetrical cutting of the conductor about its breakpoint. This substantially improves the reliability of the device by substantially reducing the possibility that conductive material will remain connecting the upper and lower conductors after the fusing process has been implemented. It will be understood that in the three-terminal fuse device of the prior co-pending application, the conductor structure used to ensure symmetric cutting can be used for either the upper or lower conductor.

In another embodiment of the present invention, the programmable antifuse structure is formed over the polysilicon gate of a field-effect transistor (FET), and the FET serves as the heat generating programming structure. The FET includes a substrate separated from the polysilicon gate by a gate insulator material. The source and drain of the FET are formed on opposite sides of the gate. The lower conductor of the antifuse structure is formed over the polysilicon gate. The thick transformable insulator of the antifuse is formed over the lower conductor, and the upper conductor is formed over the thick transformable insulator. To program the antifuse, a programming voltage is applied across the polysilicon gate and either the substrate, the source or the drain of the FET. Sufficient voltage is applied to cause the gate insulator to break down such that current flows across the gate insulator. The resulting heat is conducted by the polysilicon gate material to the lower conductor of the antifuse structure. As described above, the heat causes a permanent conductive link to be formed between the lower and upper conductors across the thick transformable insulator.

In another embodiment, the heat generating programming structure is a p-n junction in thermal communication with the programmable antifuse structure. When a voltage is applied to forward bias the p-n junction, heat is generated by the current flowing through the junction. As described above, the heat causes the permanent link to form between the two conductors across the transformable insulator of the antifuse structure.

In the embodiments which use the FET and the p-n junction as the programming structure, substantial fabrication expense can be avoided. Both structures are well characterized and are readily and inexpensively fabricated in mass production environments.

As mentioned above, the transformable insulator of the antifuse of the invention can be made thicker than that of prior antifuse structures. This is because the process of forming a link depends upon thermal breakdown of the insulator rather than breakdown induced by applied electric field as used in prior devices. In one embodiment, the insulator is between 300 and 2,000 angstroms thick and is preferably between 300 and 1,000 angstroms thick. The insulator material can be amorphous silicon, oxide of silicon (silicon oxide), nitride of silicon (silicon nitride) or a composite of oxide and nitride of silicon. Preferably, the transformable insulator is a three-layer composite of oxide - nitride - oxide of silicon (ONO) or nitride - oxide - nitride of silicon (NON).

The conductors of the present invention are preferably multi-layer conductors which include layers of non-refractory metals such as aluminum and refractory metals such as titanium, tungsten or molybdenum. Preferably, the lower conductor M1 is a three-level composite including a lower level of aluminum covered by a layer of titanium which is capped by a thin layer of aluminum. In one embodiment, the middle titanium layer is made much thicker titanium layers used in prior antifuse devices. In the prior devices, the titanium layer was commonly about 200 angstroms thick or less. In the present invention, to enhance migration of reactive titanium into silicon oxide or silicon nitride insulator layers, the titanium of the conductors is made at a thickness of about 500 angstroms. At high programming temperatures, the titanium reacts with the oxide or nitride of silicon to promote formation of conductive material such as titanium nitride or titanium oxides, across the insulator. Thus, even if the heat shock to the insulator does not fracture the insulator, the induced titanium reactions will still cause a permanent link to be formed across the insulator.

In a preferred embodiment, the middle conductor M2 is also a multi-layer conductor including five alternating layers of refractory and non-refractory metals. Preferably, M2 includes a lower thin aluminum capping layer covered by a layer of titanium approximately 500 angstroms thick which is covered by a thick layer (approximately 7,500 angstroms) of aluminum. The middle thick aluminum layer is covered by another 500-angstrom titanium layer which is covered by another thin aluminum capping layer.

The programmable link structure of the present invention provides numerous advantages over prior antifuse or programmable link structures. The antifuse of the present invention allows a thicker transformable insulator to be used than is used in prior devices. The thicker insulator reduces the capacitance of unprogrammed antifuse structures. In addition, because the insulator is thicker, irregularities do not result in inadvertent link programming, and thus the lifetime of the circuit is enhanced considerably.

Also, the programmable circuit of the invention allows links to be formed between conductors without requiring that a programming bias be applied directly across the conductors being linked. As a result, the risk of damaging or stressing other circuitry connected to the conductors with applied programming voltages and currents can be greatly reduced.

In prior antifuse devices, the conductive link is formed at the site of a thin conductive filament where the link insulator breaks down under applied electric field. Another advantage of the programmable circuit of the invention is that, in contrast to the prior devices, the conductive link can be formed over the entire area of the link structure. This results in a programmed link having a much higher current carrying capability than those found in prior devices.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
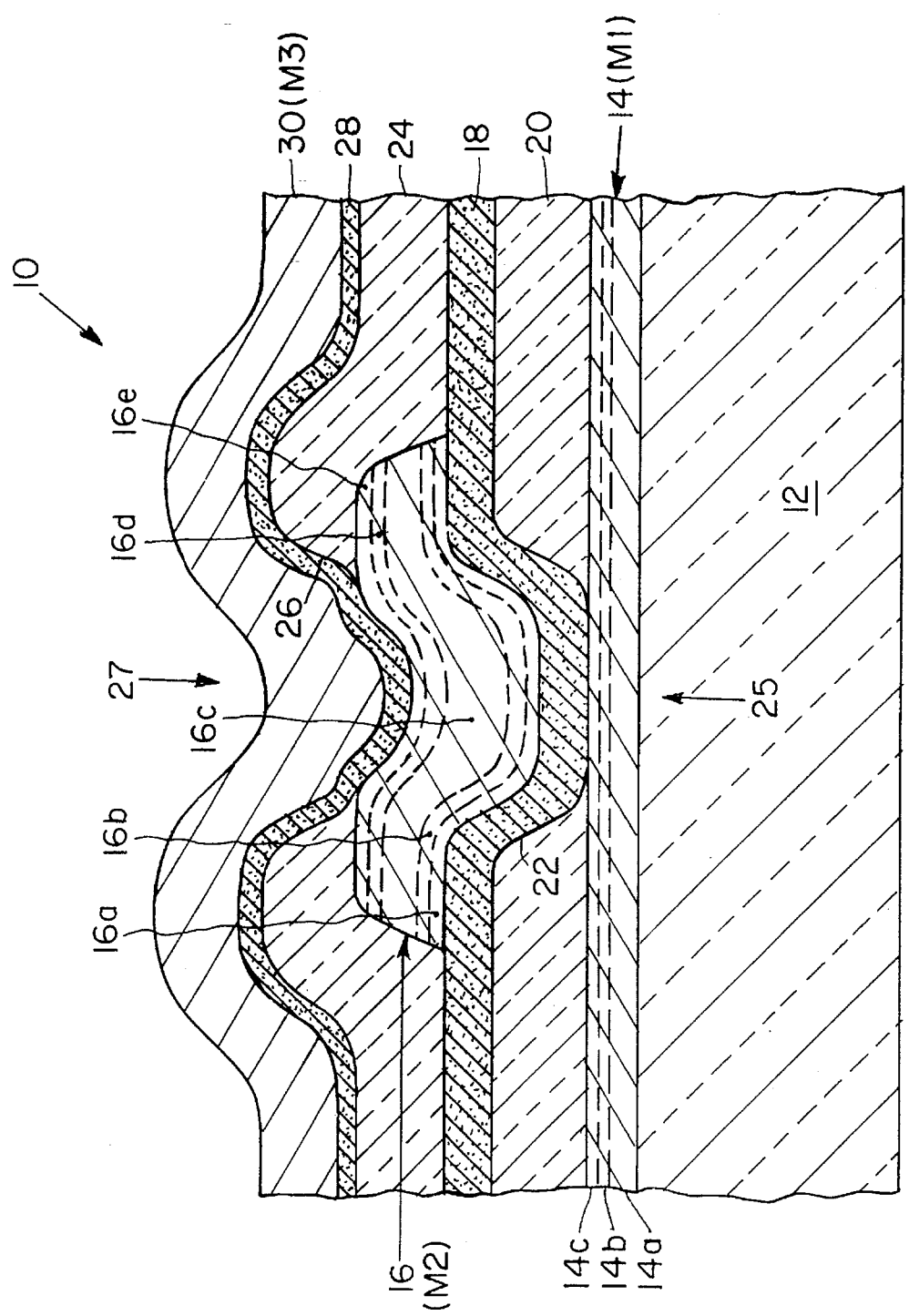
FIG. 1 is a schematic cross section of one embodiment of the programmable integrated circuit of the invention.

FIG. 1 is a schematic cross sectional view of one embodiment of the programmable integrated circuit 10 of the invention. The circuit 10 includes a heat generating programming structure 27 and a programmable link or antifuse structure 25. The programming structure 27 includes upper conductor M3 identified by reference numeral 30, middle conductor M2 identified by reference numeral 16 and a thin transformable link insulator 28 separating M2 and M3. The antifuse structure includes the middle conductor 16, a lower conductor M1 identified by reference numeral 14 and a thick transformable link insulator layer 18 separating M1 and M2.

The lower conductor 14 is formed over the top of a smooth substrate 12. The substrate can be a semiconductor material with an insulating overlayer which can be silicon dioxide, such as where the programmable circuit structure is used in conjunction with other integrated circuits. Alternatively, the substrate 12 can be any smooth material such as glass, ceramic, etc. In the embodiment shown in FIG. 1, the lower conductor 14 includes three layers of conductive materials. The lower layer 14a is made of a non-refractory metal such as aluminum and is approximately 7,500 angstroms thick. Layer 14b is made of a refractory metal such as titanium. In prior antifuse structures, this middle refractory layer is typically about 200 angstroms thick. However, in the present invention, it is preferably about 500 angstroms thick. As will be described below in detail, the additional thickness of the refractory layer 14b enhances the transformation of the transformable insulator 18 into a conductor during programming to facilitate formation of the permanent conductive link. Layer 14c is a thin conductive capping layer made of non-refractory metal such as aluminum and having a thickness of about 200 angstroms.

After the lower conductor layer 14 is formed, an interlevel dielectric layer 20 is formed over the lower conductor 14. After the dielectric layer 20 is formed, a via hole 22 is formed through the dielectric layer 20 at the programmable link site. The via hole 22 extends through the dielectric layer 20 to expose the top surface of the lower conductor 14.

After the via hole 22 is formed, the lower transformable link insulator layer 18 is formed over the interlevel dielectric layer 20. The link insulator 18 covers the interlevel dielectric 20 and extends into the via hole 22 down to the top surface of the lower conductor 14. In an alternative embodiment, the lower transformable link insulator layer is a flat layer formed over the lower conductor. In that embodiment, a suitable etch stop is formed between the lower link insulator and the interlevel dielectric to prevent damage to the lower link insulator by subsequent etching of the via hole. Such structures are described in commonly assigned co-pending U.S. patent application Ser. Nos. 07/918,586 and 08/210,062, which are incorporated herein in their entirety by reference.

In one preferred embodiment, the transformable link insulator layer 18 is a three-layer composite insulator. The lowest layer is made of silicon nitride, the middle layer is silicon oxide, and the upper layer is silicon nitride. Such a structure is commonly referred to as an NON composite insulator. The link insulator 18 can also be an ONO composite consisting of a silicon nitride layer sandwiched between two silicon oxide layers. In other embodiments, the link insulator can consist of a single layer of silicon oxide or a single layer of silicon nitride, or it can be a two-layer composite of silicon oxide and silicon nitride.

In prior antifuse structures, transformable insulator layers were typically on the order of 300 angstroms thick, with each component layer of the composite being approximately 100 angstroms thick. In the preferred embodiment of the present invention, the insulator layer 18 is much thicker. Specifically, the thickness of the transformable insulator 18 of the present invention can be within the range of 300 angstroms to 2,000 angstroms and is preferably within the range of 300–1,000 angstroms.

Because the transformable insulator 18 is thicker than the insulator used in prior antifuse devices, the capacitance of unprogrammed antifuse structures of the present invention is less than that of the prior antifuse structures. The thicker layer of the transformable insulator 18 also improves the lifetime of the structure by preventing inadvertent link programming by operational voltage levels of the circuitry connected to the middle and lower conductors 16 and 14, respectively. Therefore, selection of the link insulator 18 thickness is strongly affected by the operational voltages used in the connected circuitry. In present technology, these voltages are typically about five volts. In the future, lower voltages may be used. In that case, the transformable link insulator 18 of the invention can be made thinner than stated above.

The middle conductor layer 16 is formed over the lower transformable link insulator layer 18. In one preferred embodiment, the middle conductor 16 is a five-layer conductor with the lowest three layers forming a mirror image of the lower conductor 14. That is, layer 16*a* is a thin capping layer made of a non-refractory metal such as aluminum. Layer 16*b* is a relatively thick layer of a refractory metal such as titanium. Its thickness is about 500 angstroms. Layer 16*c* is a thick layer of non-refractory metal such as aluminum. In the preferred embodiment, this layer is approximately 7,500 angstroms thick. Layer 16*d* is a 200-angstrom layer of refractory metal, and layer 16*e* is another thin capping layer of non-refractory metal. Thus, in a preferred embodiment, the middle conductor layers are nearly symmetric about the thick non-refractory middle layer.

A second interlevel dielectric layer 24 is formed over the middle conductor 16. After the layer 24 is formed, a second via hole 26 is formed through the interlevel dielectric 24 at the programming site to expose the top surface of the middle conductor. 16. A thin upper transformable link insulator layer 28 is then formed over the interlevel dielectric layer 24. The link insulator 28 fills the via 26 and covers the top surface of the middle conductor 16. Finally, the upper programming conductor layer 30 is formed over the second transformable insulator layer 28.

The upper programming conductor 30, the middle conductor 16, the interlevel dielectric 24 and the transformable link insulator layer 28 form a programmable three-terminal fuse structure as described in the co-pending U.S. patent application Ser. No. 08/210,344. The transformable insulator layer can be amorphous silicon, silicon oxide, silicon nitride, a silicon nitride - silicon oxide - silicon nitride (NON) composite, a silicon oxide silicon nitride - silicon oxide (ONO) composite or other known insulator material. If the insulator 28 is an oxide of silicon, the layer is approximately 200 angstroms thick. If an NON composite insulator is used, each of the component layers is approximately 100 angstroms thick, and, therefore, the entire insulator layer is approximately 300 angstroms thick. The upper programming conductor layer 30 is a non-refractory metal such as aluminum. It can also be a multi-layer composite of refractory and non-refractory metals.

The circuit 10 of FIG. 1 can be programmed to link conductors 14 and 16 of the programmable link structure 25 by applying a programming voltage across conductors 16 and 30 of the heat generating programming structure 27. For the embodiment described, the programming voltage can be within the range of 10–30 volts, and is preferably about 15 volts. During programming, the lower conductor 14 can also be tied to ground or it can be connected to the middle conductor 16 to prevent the lower conductor 14 from floating up to a high voltage and to maintain the middle and lower conductors 16 and 14 at the same potential, if desired.

When the voltage is applied, the electric field impressed across the insulator 28 causes the insulator 28 to break down. As a result, a transient conductive link forms between the conductors 16 and 30, and current flows through the insulator 28 at the transient conductive link. The current flow causes heat to be generated in the transient link and conducted away from the link into the conductors 16 and 30. The heat is conducted through middle conductor 16 to the thick transformable insulator layer 18 of the programmable structure 25. The heat applied to the insulator 18 causes a link to form across the insulator 18 between the middle conductor 16 and the lower conductor 14.

As described above, the link can form by either or both of at least two separate physical phenomena. First, the heat shock to the insulator 18 can cause the insulator 18 to fracture. The heat in the region then causes the non-refractory aluminum in the conductor layers 16 and/or 14 to melt and flow into the fracture site in the insulator 18. With sufficient current flow through the upper thin insulator 28, sufficient heat will be generated in the region to allow sufficient conductor flow into the fracture such that a permanent conductive link will be formed between the conductors 16 and 14.

Even if the thick transformable insulator 18 does not fracture, a link will still be formed between conductors 14 and 16 when the programming voltage is applied across conductors 16 and 30. As described above, the thick insulator 18 preferably includes silicon oxide and/or silicon nitride. Also, either or both of conductors 14 and 16 include reactive refractory metals such as titanium. When the conductors 16 and 14 and the insulator 18 are heated, titanium reacts with the silicon oxide and/or silicon nitride in the insulator 18. The refractory metal diffuses readily into the insulator 18 to create the conductive link between the conductors 14 and 16.

The diffusion of refractory metals into silicon oxide or silicon nitride upon heating is one reason for making the refractory layer of the conductors thicker than normally used in prior antifuse structures. With more refractory metal present, the reaction process is enhanced to facilitate formation of a permanent low-resistance link.

With a sufficiently high programming voltage applied and a sufficiently low limiting resistance used to program the three-terminal fuse structure, a high current will be generated in the transient conductive link during programming. The resulting heat will be sufficient to melt and boil away the upper programming conductor 30 at a breakpoint such that the continuity of the upper conductor 30 will be permanently interrupted. The resulting programmed structure includes the middle conductor 16 permanently linked to the lower conductor 14 across the transformable insulator 18. Upper conductor 30 is permanently cut, and no transient connection between it and either of the conductors 14 and 16 remains. Thus, the upper conductor 30 is a "sacrificial" layer used only to provide programming access to the antifuse structure.

The programmable link structure 25 of the invention is programmed without applying any voltage across the actual link structure itself. The programming voltage is applied across only one of the conductors and a third sacrificial conductor 30 which is not used after programming. Thus, the hazards associated with high programming voltages and currents applied to circuits associated with the programmable link are eliminated.

Figure 2:
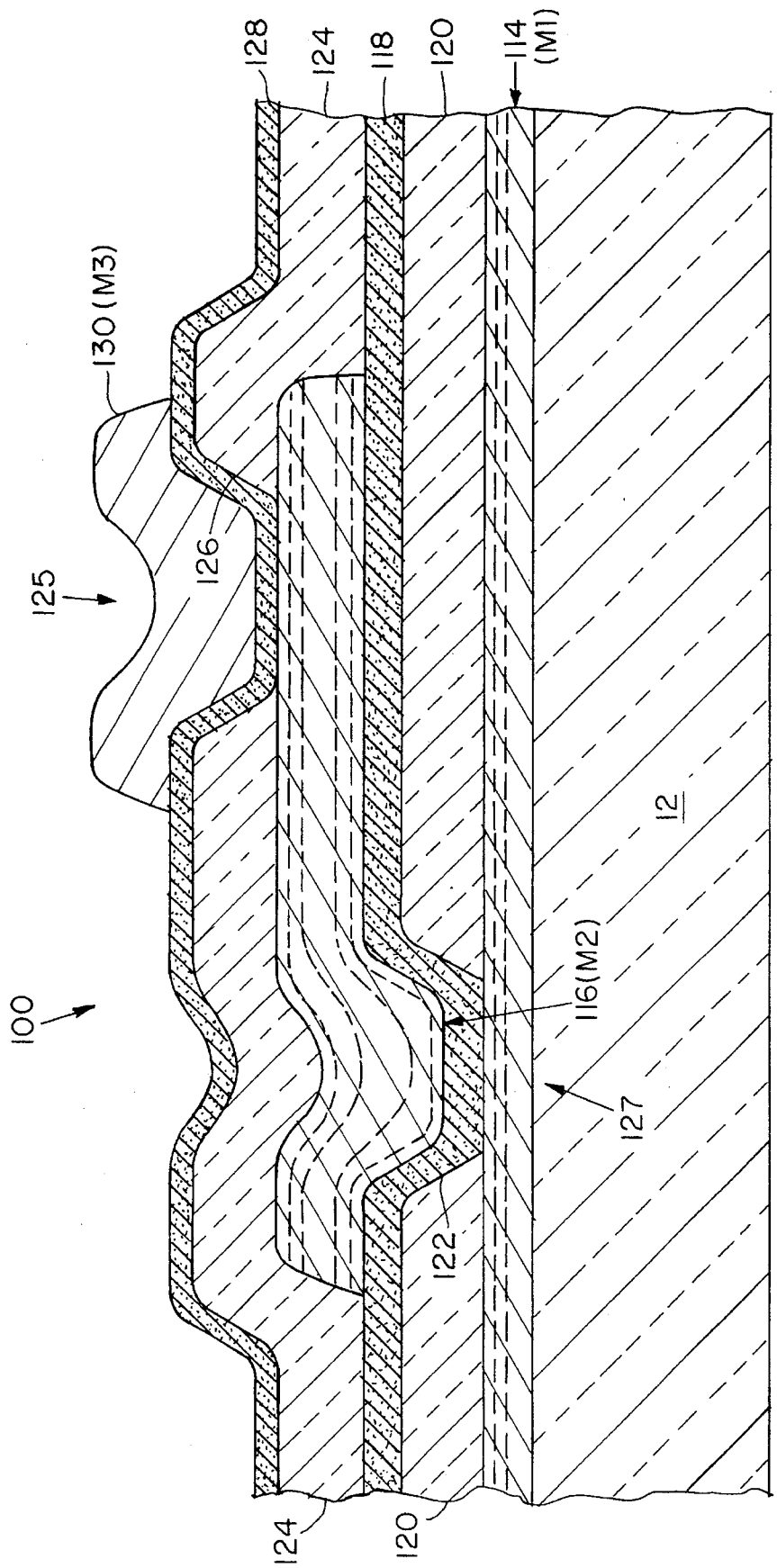
FIG. 2 is a schematic cross section of an alterative embodiment of the programmable integrated circuit of the invention.

FIG. 2 is a schematic cross sectional diagram of an alternative embodiment 100 of the programmable integrated circuit of the present invention. In the embodiment 100 illustrated in FIG. 2, the heat generating programming structure 125 is not located directly above the programmable antifuse or link structure 127. Rather, it is laterally displaced from the link structure 127.

In the alternative embodiment 100 of FIG. 2, in similar fashion to the previously described embodiment, a lower conductor 114 is formed over a substrate 12. An interlevel dielectric 120 on top of the conductor 114 is formed with a via hole 122 at the programmable link site. A thick transformable link insulator 118 is formed over the interlevel dielectric 120 and the exposed top surface of the lower conductor 114. The middle conductor 116 is formed over the thick transformable link insulator 118. It extends from the programmable link structure 127 laterally to the heat generating programming structure 125 which in this embodiment is a three-terminal fuse structure. It should be noted that both the lower conductor 114 and the middle conductor 116 preferably have the same three-layer and five-layer structures, respectively, used in the previously described embodiment, as indicated by the dashed lines.

An interlevel dielectric layer 124 is formed over the middle conductor 116. A second via hole 126 is formed through the dielectric layer 124 to expose the top surface of middle conductor 116. The thin second transformable link insulator layer 128 is formed over the dielectric layer 124 and into the via hole 126 over the exposed top layer of the conductor 116. Finally, the upper programming conductor 130 is formed over the thin transformable link insulator 128.

As in the previously described embodiment, to program the link structure such that middle conductor 116 is permanently linked to lower conductor 114, a programming voltage is applied across upper conductor 130 and middle conductor 116. The applied electric field causes the thin transformable link insulator 128 to break down such that the transient conductive link is formed. Once again, current flow through the transient conductive link causes heat to be generated in the region of the programming structure 125. This heat is conducted along middle conductor 116 to the programmable link or antifuse structure 127. The previously described phenomena take place to form the permanent conductive link between the middle conductor 116 and lower conductor 114 across the thick transformable link insulator layer 118.

As in the previous embodiment, the heat generated in the region of the programming circuit 125 also causes the upper conductor 130 to heat and boil away. Once again, the upper programming layer 130 is used only to provide programming access and is sacrificed by the programming process, and the programming takes place without a programming voltage being applied across the actual programmable link structure.

In preferred embodiments of the invention, the middle conductor layer preferably includes both refractory and non-refractory metals as described above. This combination is particularly useful for the embodiment in FIG. 2 in which the programming structure 125 is not located directly above the programmable link structure 127. The refractory metal in the conductor ensures that sufficient heat will be delivered from the programming structure 125 to the link structure 127 before conductor 130 boils away to interrupt continuity. Because the refractory metal is not a good conductor of heat, it ensures that the generated heat is localized for a sufficient period of time to allow formation of the link such as by melting and flowing of the non-refractory metal. The non-refractory metal typically used is aluminum. The refractory metals used can be titanium, tungsten, titungsten (TiW), titanium nitride (TIN), and molybdenum.

Figure 3A:
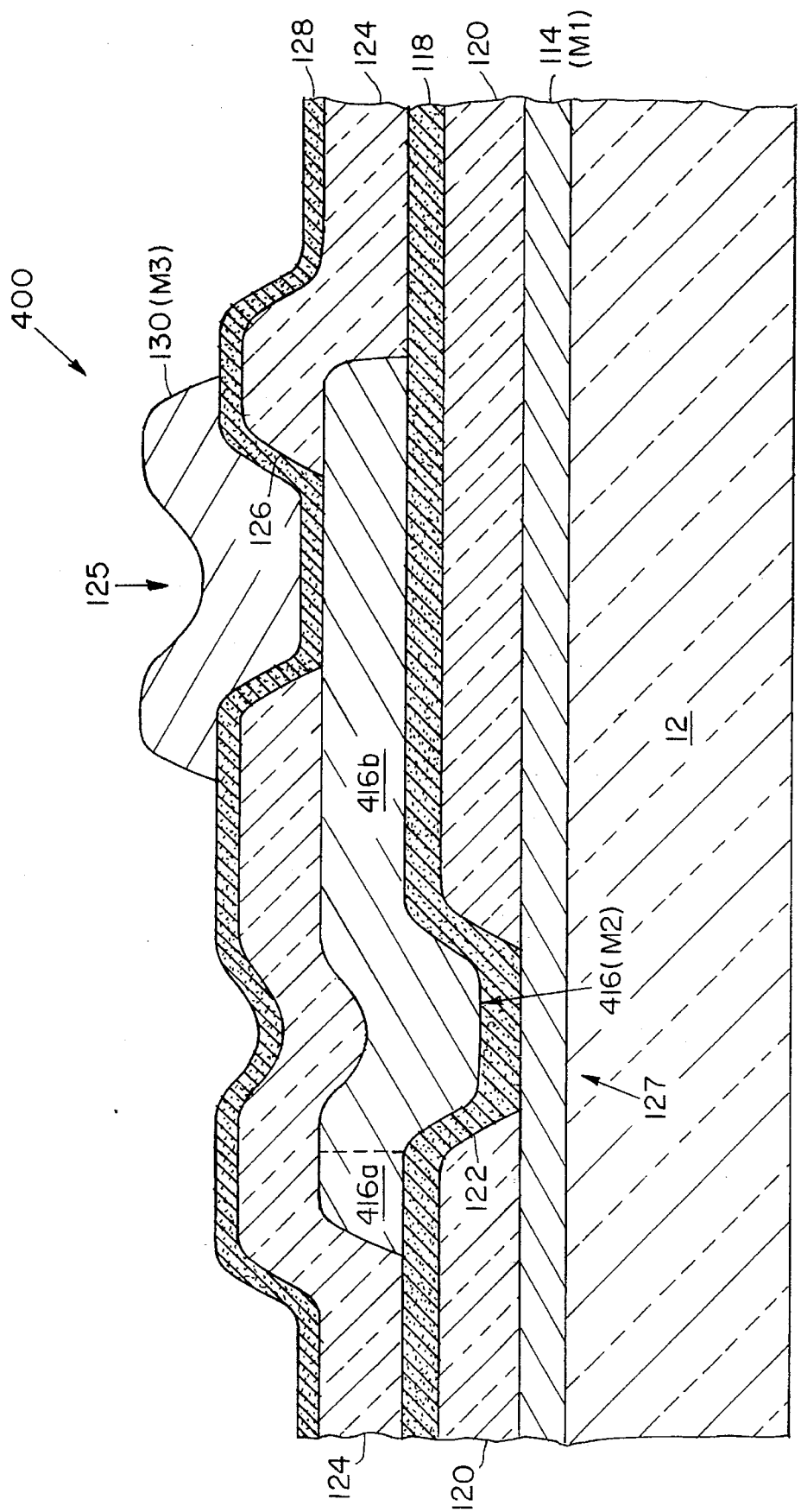
FIGS. 3A and 3B are schematic cross sections of alternative embodiments of the programmable integrated circuit of FIG. 2 showing alternative configurations of the middle conductor.
Figure 3B:
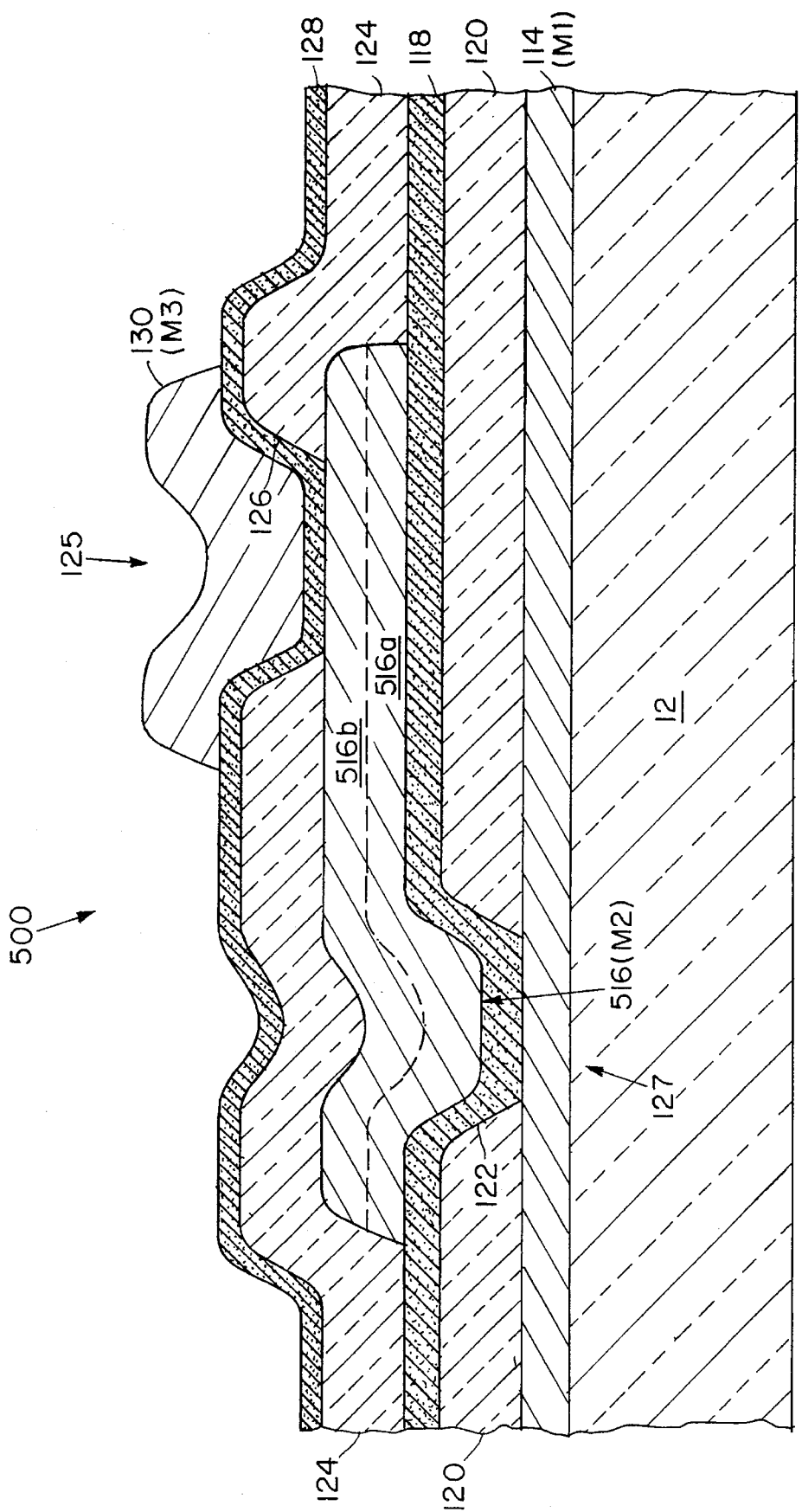

FIGS. 3A and 3B are schematic cross sections of alternative embodiments of the circuit of FIG. 2 showing two different configurations for the middle conductor. In FIG. 3A, the conductor 416 includes non-refractory metal 416a near the link structure 127 used to carry electrical signals for the connected circuitry and refractory metal 416b running from the programming structure 125 to the link structure 127. When the programming structure 125 heats, the refractory metal 416b conducts heat to the link structure 127.

FIG. 3B shows an alternative embodiment of the middle conductor 516 which includes a lower layer 516a of non-refractory metal such as aluminum and an upper layer 516b of refractory metal. Once again, the refractory metal 516b ensures that sufficient heat is delivered to the link structure 127 and prevents the heat from being conducted away from the link structure 127 such that the permanent link can be formed upon programming.

Figure 4:
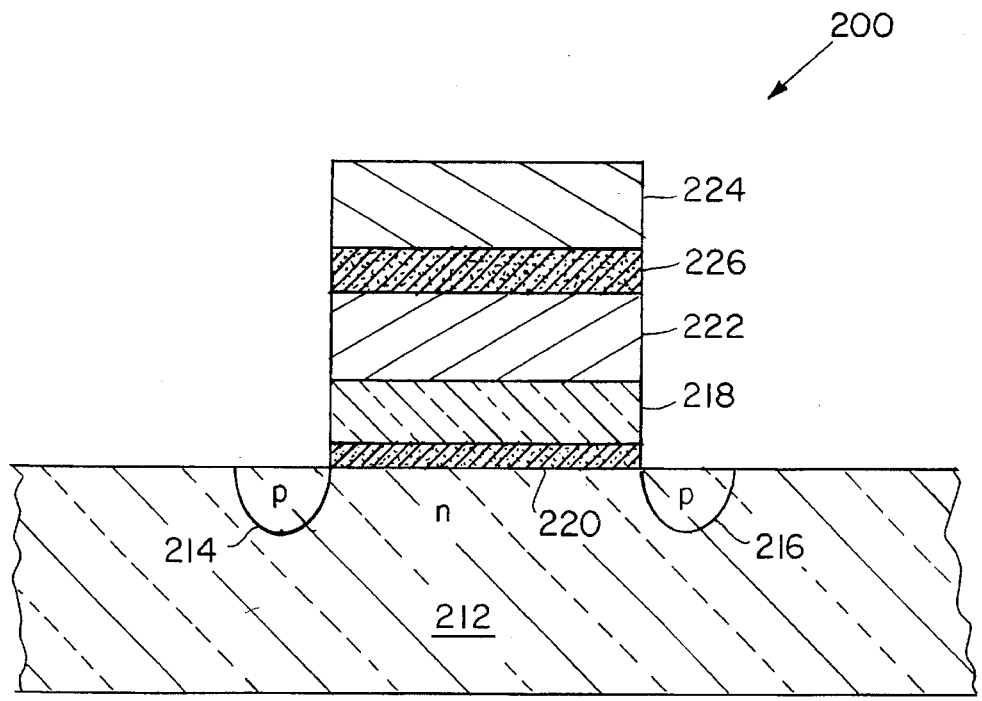
FIG. 4 is a schematic side view of another alternative embodiment of the programmable integrated circuit of the invention.

FIG. 4 is a schematic side view of another embodiment 200 of the programmable integrated circuit of the present invention. In the embodiment of FIG. 4, the heat generating programming circuit is a field-effect transistor (FET). The FET used to program the programmable link structure includes an n-type substrate 212 in which are formed a p-type source 214 and p-type drain 216 of the FET. It will be understood that the doped polarities can be reversed. The FET also includes a gate 218 made of polysilicon separated from the substrate 212 by a gate insulator 220 made of insulating material such as silicon dioxide.

Figure 5:
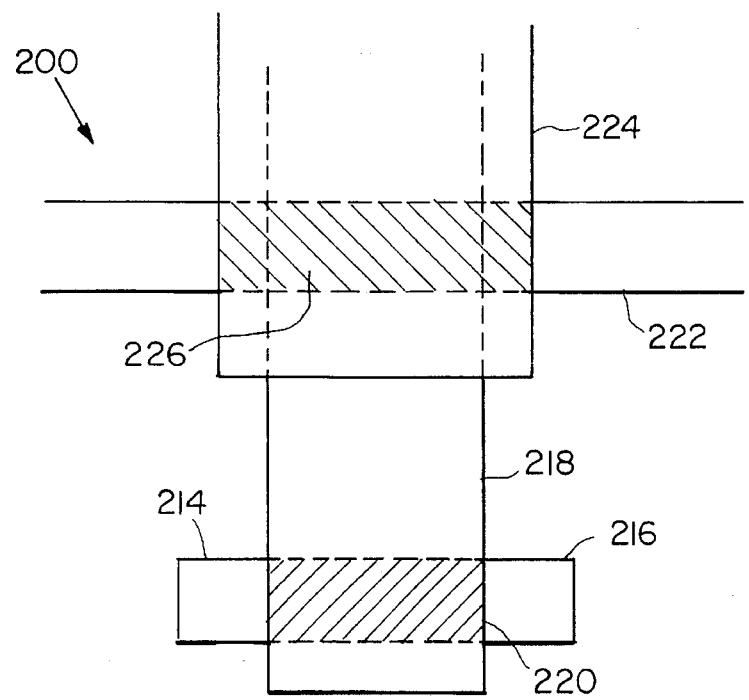
FIG. 5 is a schematic top view of an actual implementation of the embodiment of the programmable integrated circuit shown in FIG. 3.

The programmable link or antifuse structure of the embodiment of FIG. 4 includes a lower conductor 222 separated from an upper conductor 224 by a transformable insulator layer 226. The details of the link structure are the same as described above in connection with the embodiment of FIG. 1. Also, the details of the individual layers and additional required layers such as interlevel dielectrics are omitted in the interest of clarity. FIG. 5 is a top view of an actual implementation of the embodiment 200 of the invention shown in FIG. 4.

To program the device shown in FIGS. 4 and 5, a programming voltage is applied across the polysilicon gate 218 and either the source 214, the drain 216 or the substrate 212 of the FET. The programming voltage can be between 10 and 30 volts and is preferably about 15 volts. With sufficiently high programming voltage applied, the gate insulator 220 breaks down, and current flows across the gate insulator 220 to heat the region around the gate insulator. The heat is conducted by the polysilicon gate 218 to the programmable antifuse structure 222, 224, 226. As in the previous embodiments, the transformable insulator layer 226 can fracture due to heat shock, and molten conductive material from the conductors 222 and/or 224 can flow into the fracture area to create the permanent link. Alternatively, refractory conductive materials in the conductor layers 222 and/or 224 can react with the transformable insulator layer 226 to form the link.

It should be noted that when the programming voltage is applied across the gate 218 and either the source 214 or drain 216, the voltage is actually biasing a p-n junction formed by either the source 214 or drain 216 and the substrate 212. With the p-n junction forward biased by sufficiently high programming voltage, current will flow across the p-n junction through the link insulator 220 to generate heat. With a higher programming voltage applied to reverse bias the p-n junction, current can also again flow through the p-n junction and the gate insulator 218 to form the link.

The embodiment of FIGS. 4 and 5 has the advantage of using existing fabrication techniques to create the programming structure. That is, it is very common in the integrated circuit industry to create FET structures and p-n junctions on substrates inexpensively and in mass quantities. Such structures can be created inexpensively, efficiently and very reliably with extremely high yields. No special manufacturing techniques are required.

Referring back to FIG. 1, it will be noted that to program the circuit 10, the programming voltage can be applied to either the left or right end of the upper programming conductor 30. Current will flow into the programming structure 27 from the end at which the programming voltage is applied. For example, if the programming voltage is applied to the left side of the upper conductor 30 and the return is applied to the middle conductor 16, the transformable insulator 28 will break down, and current will flow from the left side of the upper conductor 30 into the via hole 26 along its left side, through the transient conductive link and into the middle conductor 16.

In this situation, as the programming structure 27 continues to heat, the upper conductor 30 begins to melt and boil away at the left side of the via hole 26. The possibility exists that the left side of the upper conductor will completely boil away to interrupt its continuity before the right side has boiled away. After the left side is cut, the programming voltage source is cut off and no further current flows. Therefore, the remaining portion of the upper conductor 30 on the right side of the via hole remains intact. It is possible that a permanent conductive link will remain between the upper conductor 30 at the right side of the via hole 26 and the middle conductor 16. In the programmable integrated circuit of the present invention, the result of this situation is that, after programming, all three conductors 14, 16 and 30 may be shorted together. In the prior co-pending U.S. patent application Ser. No. 08/210,344, this situation results in a failed attempt to fuse one of the conductors, either the upper conductor or the lower conductor.

One approach to solving this problem is to apply the programming voltage to the upper conductor 30 on both sides of the via hole 26. Under those conditions, the programming current would flow into the programming structure 27 from opposite sides of the via hole 26. The conductor would melt and boil away evenly on both sides of the via hole 26 such that, after programming, the chances of conductive material remaining in the via hole 26 would be greatly reduced if not eliminated.

The problem with this approach is that, in practical situations, a typical programmable integrated circuit will include many programmable fuse or antifuse structures all connected to and programmed by a single programming conductor 30. In such circuits, applying the programming voltage to both sides of a link or fuse is possible for only one link site. After the upper conductor 30 is blown away at that site, it can no longer be used to program other sites from both sides.

A further aspect of the present invention is an upper programming conductor which allows the programming voltage to be applied from a single side of the link site, i.e., asymmetrically, but also directs the current into the via hole of the programming circuit on opposed sides such that the heat generated will boil away the conductor symmetrically around the via hole and no residual conductive material remains at the via hole after programming.

Figure 6A:
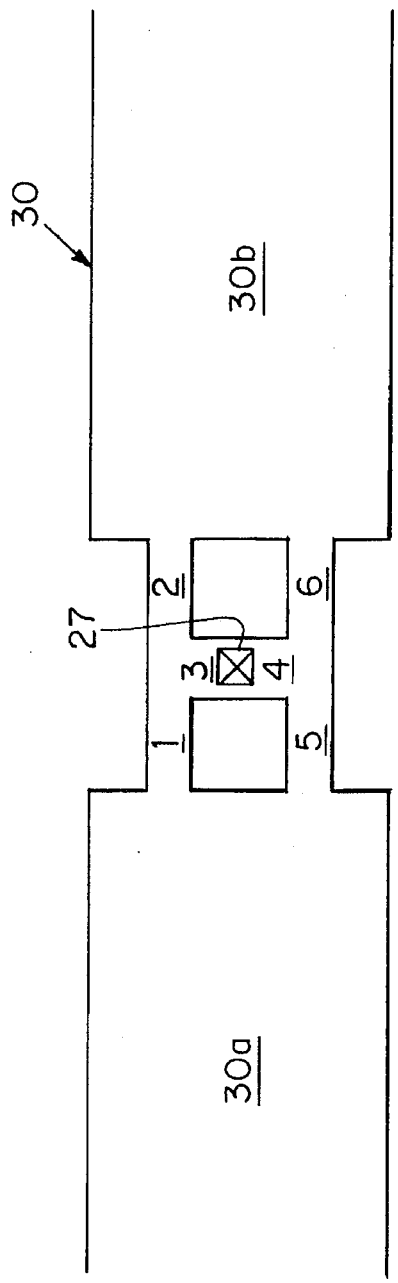
FIGS. 6A–6D are schematic illustrations of a programming conductor used to ensure symmetric cutting upon asymmetric application of a programming voltage.
Figure 6B:
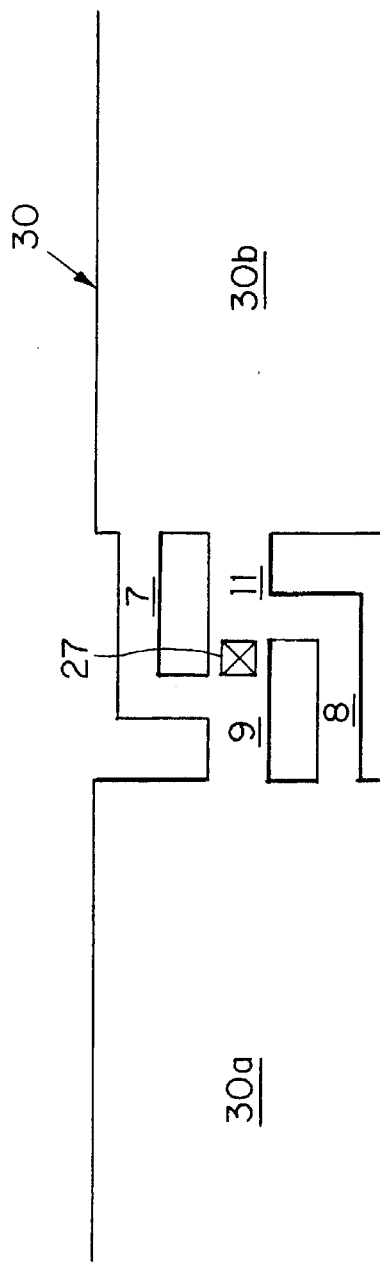
Figure 6C:
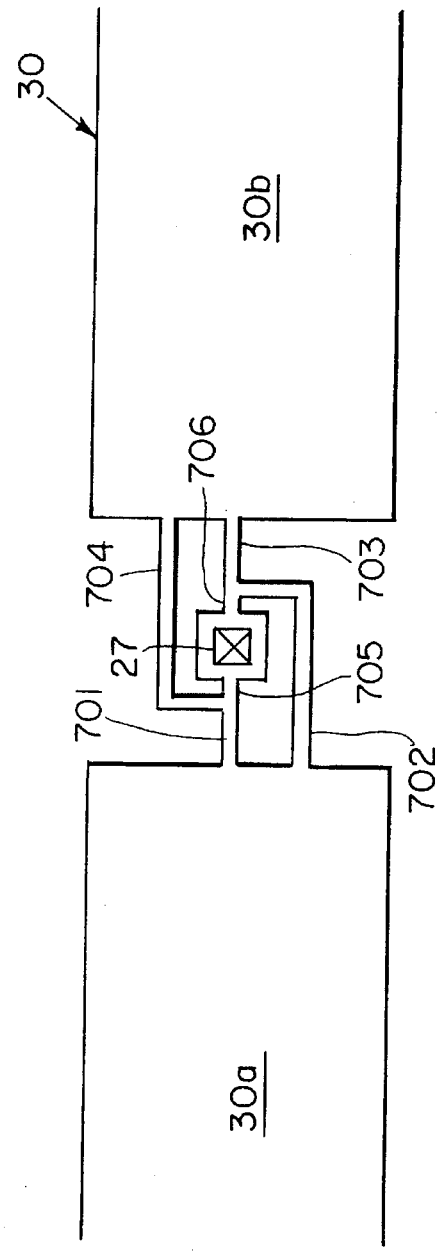

FIGS. 6A–6C are schematic top views of three conductors which provide for symmetric cutting with respect to the via hole of the programming structure upon asymmetric application of the programming voltage. These programming conductors can be used as the upper conductor in the heat generating programming structure of the programmable circuit of the present invention and can also be used as either of the two conductors described in the prior co-pending three-terminal fuse U.S. patent application Ser. No. 08/210,344.

FIG. 6A shows one embodiment of the upper programming conductor 30 used to ensure symmetric cutting of the conductor with asymmetric application of the programming voltage. With the programming voltage applied to the left side 30a of the upper conductor 30, programming current flows into the programming structure 27 along the conductor branch sections labeled 1, 3, 5 and 4. Thus, the current enters the programming structure on opposite sides of the eventual conductor breakpoint along the transverse branch labeled 3 and 4. Heat generated by the current flows back up into the conductor 30 evenly on sections 3 and 4, which melt and boil away along with sufficient portions of branches 1, 2, 5 and 6 to interrupt the continuity between sections 30a and 30b of the conductor 30. If the programming voltage is applied at the end 30b of the conductor 30, the programming current flows through conductor branch sections 2, 3, 4 and 6. Once again, with asymmetric application of programming voltage, current enters the programming structure 27 on opposite sides, and the conductor 30 is cut symmetrically.

FIG. 6B shows another embodiment of the upper conductor 30 used to ensure symmetric cutting upon asymmetric application of a programming voltage. If the programming voltage is applied to the end 30a of the conductor 30, the current will flow into the heat generating programming structure 27 along branches 9 and 8. If the programming voltage is applied to 30b, the current enters the programming structure 27 along branches 7 and 11. In either case, the programming voltage is applied asymmetrically, but the current enters the programming structure from opposite sides to ensure symmetric cutting of the conductor 30.

FIG. 6C shows another embodiment of the conductor 30. In FIG. 6C, with the programming voltage applied to end 30a, programming current flows into the link structure 27 through conductor branches 701 and 702. With the programming voltage applied to end 30b, the programming current flows through branches 703 and 704. In either case, sufficient heat is generated to destroy branch sections 705 and 706 and surrounding conductor material such that continuity between the ends 30a and 30b of the conductor 30 is completely interrupted.

It should be noted that the structures shown in FIGS. 6A–6C ensure symmetric cutting even if one of the small branches boils away before another. For example, in FIG. 6A, with the programming voltage applied to end 30a, current will simultaneously flow into the programming structure along branch sections 3 and 4. If the continuity in branches 1 and 3 is completely destroyed before that of branches 4 and 5, the current will cease to flow through branches 1 and 3. However, since continuity still exists along branches 4 and 5, current will continue to flow in them. Heating, melting and boiling away of branches 4 and 5 will continue until their continuity is also interrupted. This is also true for the conductor structures shown in FIGS. 6B and 6C.

Figure 6D:
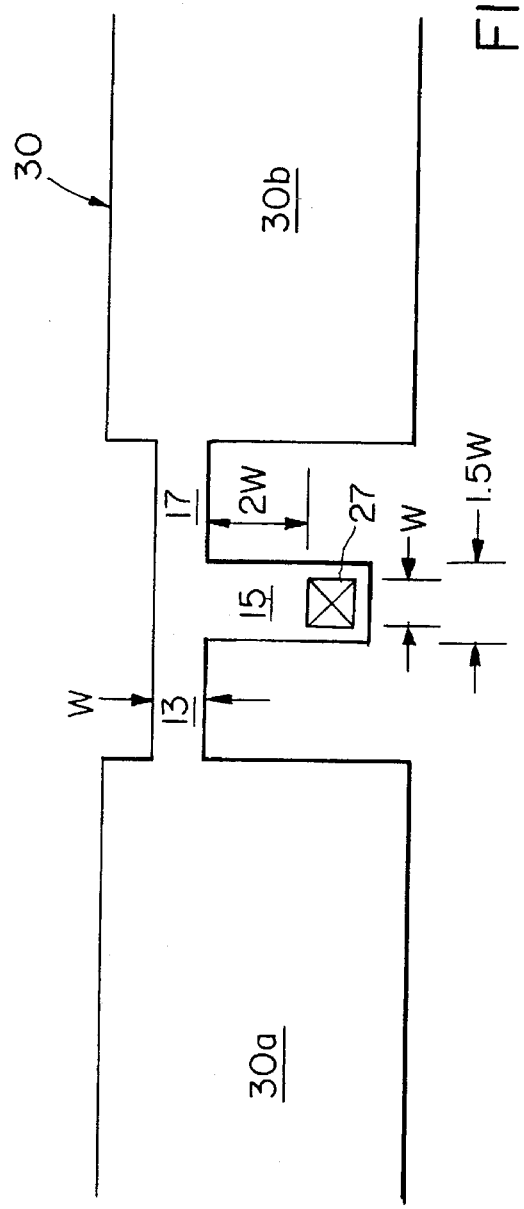

FIG. 6D shows another embodiment of the upper conductor 30 shaped to provide for symmetric cutting with asymmetric application of programming voltage. If the programming voltage is applied to the end 30a of the conductor 30, the programming current will flow through branches 13 and 15 into the programming structure 27. With sufficient current, sufficient heat will be generated to boil away branch 15 of the conductor 30 and a sufficient portion of branches 13 and 17 to permanently interrupt the continuity between ends 30a and 30b. To ensure that sufficient melting and boiling away takes place, the width of the branches 13, 17 and 15 and the programming structure 27 as well as the length of branch 15 are preselected. In one embodiment, with the width of the programming structure being W, the width of branches 13 and 17 is also W, the width of branch 15 is 1.5 W, and the length of branch 15 is 2 W. In one preferred embodiment, W is approximately 1 μm. These values can change according to programming voltage used, conductor thickness, conductor material, programming limiting resistance, and many other factors.

Another feature of the conductor structures shown in FIGS. 6A–6D is that the resistance of the conductor 30 at the programming structure 27, albeit very small, is eliminated from the circuit. Because of the shape of the via hole, the upper conductor 30 can have bends and local thinning in the region of the via hole which add resistance to the conductor 30. This added resistance can result in slower circuitry and higher required programming voltages. Since each of the conductor structures shown in FIGS. 6A–6D provide bypass conductive paths between the ends 30a and 30b of the conductor 30, the series resistance of the programming structure 27 is eliminated from the circuit.

While this invention has been particularly shown and described with references to preferred embodiments thereof, it will be understood by those skilled in the art that various changes in form and details may be made therein without departing from the spirit and scope of the invention as defined by the appended claims. For example, the various embodiments discussed above include different types of programming structures used to generate heat to program the link structure. It will be understood that other types of heat generating structures are possible. For example, a simple resistor which generates heat upon applied programming voltage may also be formed in thermal communication with the programmable link structure to program the circuit of the invention.

The invention claimed:

1. An integrated circuit for interrupting continuity of a conductive lead at a breakpoint comprising:

a control electrode adjacent to the breakpoint; and an insulator between the control electrode and the conductive lead such that, upon application of a programming voltage across the insulator between the conductive lead and the control electrode, a transient conductive link is formed across the insulator, current through the conductive lead and the transient conductive link heating around the transient conductive link sufficiently to destroy the conductive lead at the breakpoint; wherein the conductive lead is shaped into a plurality of conductive branches near the breakpoint arranged such that the current flowing from one end of the conductive lead to the transient conductive link is split to flow along the conductive branches of the conductive lead into the transient conductive link from different sides of the breakpoint.

2. The integrated circuit of claim 1 wherein the conductive lead comprises:

a pair of conductive branches running parallel to each other on opposed sides of the breakpoint; and a transverse conductive branch connecting the pair of parallel branches at the breakpoint.

3. The integrated circuit of claim 1 wherein the transient conductive link is in thermal communication with a programmable link structure comprising a pair of conductors separated by a transformable insulator, heat from the transient conductive link forming a permanent conductive link between the pair of conductors through the transformable insulator.

4. An integrated circuit for interrupting continuity of a conductive lead at a breakpoint between ends of the conductive lead, the integrated circuit comprising:

a control electrode adjacent to the breakpoint; and an insulator between the control electrode and the conductive lead such that, upon application of a programming voltage across the insulator between the conductive lead and the control electrode, a transient conductive link is formed across the insulator, current through the conductive lead and the transient conductive link heating around the transient conductive link sufficiently to destroy the conductive lead at the breakpoint; wherein the conductive lead comprises a first branch connecting the ends of the conductive lead across the breakpoint and a second side branch connected to the first branch at the breakpoint such that the current flowing from one end of the conductive lead to the transient conductive link flows through the side branch into the transient conductive link.

5. A method of forming links in integrated circuits comprising:

providing a programmable link structure comprising first and second conductors separated by a transformable insulator;

providing a heat generating programming structure in thermal communication with the programmable link structure such that, upon application of a programming voltage, programming current that does not flow through the transformable insulator of the programmable link structure flows through the heat generating programming structure to generate heat; and applying the programming voltage across the heat generating programming structure such that the programming current that does not flow through the transformable insulator of the programmable link structure flows through the heat generating programming structure to generate heat, the heat causing a conductive link to form between the first and second conductors across the transformable insulator of the programmable link structure.

6. A programmable integrated circuit for forming conductive links comprising:

a programmable link structure comprising first and second conductors separated by a transformable insulator; and a heat generating programming structure in thermal communication with the programmable link structure such that, upon application of a programming voltage, programming current that does not flow through the transformable insulator of the programmable link structure flows through the heat generating programming structure to generate heat the heat from the heat generating programming structure causing a conductive link to form between the first and second conductors across the transformable insulator of the programmable link structure.

7. The programmable integrated circuit of claim 6 wherein the heat generating programming structure comprises a programmable three-terminal fuse structure.

8. The programmable integrated circuit of claim 6 wherein the heat generating programming structure comprises a p-n junction.

9. The programmable integrated circuit of claim 6 wherein the heat generating programming structure comprises a gate and a gate insulator of a field effect transistor.

10. The programmable integrated circuit of claim 6 wherein the transformable insulator comprises silicon oxide.

11. The programmable integrated circuit of claim 6 wherein the transformable insulator comprises silicon nitride.

12. The programmable integrated circuit of claim 6 wherein the transformable insulator comprises a silicon oxide-silicon nitride-silicon oxide (ONO) composite.

13. The programmable integrated circuit of claim 6 wherein the transformable insulator comprises a silicon nitride - silicon oxide - silicon nitride (NON) composite.

14. The programmable integrated circuit of claim 6 wherein the transformable insulator has a thickness in a range of 300 to 2,000 angstroms.

15. The programmable integrated circuit of claim 6 wherein the transformable insulator has a thickness greater than 300 angstroms.

16. The programmable integrated circuit of claim 1 wherein the heat generating programming structure comprises a third conductor and one of the first and second conductors of the programmable link structure, the programming current flowing through the third conductor and the one of the first and second conductors upon application of the programming voltage.

17. The programmable integrated circuit of claim 16 wherein the first, second and third conductors are arranged in a stack.

18. The programmable integrated circuit of claim 6 wherein the first and second conductors comprise a layer of refractory metal.

19. The programmable integrated circuit of claim 18 wherein the refractory metal is titanium.

20. The programmable integrated circuit of claim 18 wherein the layer of refractory metal has a thickness in a range of 200 to 1,000 angstroms.

21. The programmable integrated circuit of claim 18 wherein the layer of refractory metal has a thickness greater than 200 angstroms.

* * * * *

UNITED STATES PATENT AND TRADEMARK OFFICE
CERTIFICATE OF CORRECTION

PATENT NO. : 5,572,050
DATED : November 5, 1996
INVENTOR(S) : Simon S. Cohen

It is certified that error appears in the above-indentified patent and that said Letters Patent is hereby corrected as shown below:

In Claim 6, column 14, line 54, after "generate heat," insert
---,---.

In Claim 16, column 15, line 18, change "claim 1" to
---claim 6---.

Signed and Sealed this

Fourth Day of February, 1997

Attest:

BRUCE LEHMAN

*Attesting Officer*  *Commissioner of Patents and Trademarks*